United States Patent
Kuroki

(10) Patent No.: US 8,271,824 B2
(45) Date of Patent: Sep. 18, 2012

(54) MEMORY INTERFACE AND OPERATING METHOD OF MEMORY INTERFACE

(75) Inventor: Reiko Kuroki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 267 days.

(21) Appl. No.: 12/588,849

(22) Filed: Oct. 29, 2009

(65) Prior Publication Data
US 2010/0115324 A1    May 6, 2010

(30) Foreign Application Priority Data
Oct. 30, 2008    (JP) .................. 2008-279218

(51) Int. Cl.
G06F 1/04 (2006.01)
G06F 1/12 (2006.01)
G06F 1/10 (2006.01)
G11C 11/409 (2006.01)

(52) U.S. Cl. ........ 713/401; 713/400; 713/500; 713/502; 713/503; 713/600; 713/601; 365/189.15; 365/194

(58) Field of Classification Search .......... 713/400–401, 713/500–503, 600–601; 365/189.011, 189.02, 365/189.15, 193–194; 711/100–173; 710/1–74
See application file for complete search history.

(56) References Cited

U.S. PATENT DOCUMENTS

| | | | |
|---|---|---|---|
| 5,828,871 A * | 10/1998 | Kawaguchi et al. | .......... 713/600 |
| 7,412,616 B2 * | 8/2008 | Matsui et al. | ................. 713/401 |
| 7,567,880 B2 | 7/2009 | Iizuka | |
| 2004/0213051 A1 * | 10/2004 | Lin et al. | ........................ 365/194 |
| 2007/0226529 A1 * | 9/2007 | Huang | ........................... 713/401 |
| 2007/0240008 A1 | 10/2007 | Ando | |
| 2008/0276112 A1 * | 11/2008 | Matsui et al. | ................. 713/401 |

FOREIGN PATENT DOCUMENTS

| | | |
|---|---|---|
| JP | 2007-12166 | 1/2007 |
| JP | 2007-280289 | 10/2007 |
| JP | 2008-52335 | 3/2008 |

* cited by examiner

Primary Examiner — Fahmida Rahman
(74) Attorney, Agent, or Firm — McGinn IP Law Group, PLLC

(57) ABSTRACT

A memory interface circuit includes a clock signal supply buffer configured to send a system clock signal which is supplied through a reference node, to a memory through a transmission line; a data strobe buffer configured to receive a data strobe signal supplied from the memory; a system clock synchronizing circuit configured to supply a data read from the memory to a logic circuit in synchronization with the system clock signal; and a delay detecting circuit provided at a front stage to the system clock synchronizing circuit and configured to detect a transmission delay from the clock signal supply buffer to the data strobe buffer. The delay detecting circuit generates a phase difference data indicating the transmission delay based on a difference between a phase of the system clock signal and a phase of the data strobe signal outputted from the data strobe buffer, and supplies the phase difference data to the system clock synchronizing circuit. The system clock synchronizing circuit generates a read clock signal by shifting the system clock signal based on the phase difference data, and controls a supply timing at which the data is supplied to the logic circuit, based on the read clock signal.

15 Claims, 13 Drawing Sheets

MEMORY INTERFACE AND OPERATING METHOD OF MEMORY INTERFACE

INCORPORATION BY REFERENCE

This patent application claims a priority on convention based on Japanese Patent Application No. 2008-279218. This disclosure thereof is incorporated herein be reference.

BACKGROUND OF THE INVENTION

1. Field of the Invention

The present invention relates to a memory interface and an operating method of the memory interface.

2. Description of Related Art

With advance of an information processing technique, a semiconductor memory device has spread which attains a high-speed operation and a low power consumption amount. In such a semiconductor memory device, a data strobe signal (DQS) is employed in order to achieve high-speed data communication. Examples of the semiconductor memory device using the data strobe signal (DQS) are such as DDR2 (Double Data Rate 2) SDRAM (Synchronous DRAM) and DDR3 SDRAM, which have a data transfer rate in a Gbps band.

Generally, a memory interface is provided between the semiconductor memory device and a CPU. The memory interface is mounted based on a result of board mounting simulation including an extended interconnection on a circuit board. In recent years, in the semiconductor memory device, even when the mounting according to the simulation result is achieved, variation in a delay time of an input/output buffer occurs depending on a relative accuracy of the mounting wiring and a temperature of the mounting board with a faster system clock signal and a lower power supply voltage due to an increase in a data rate. Thus, there is a demand for a memory interface circuit which can adjust the delay time depending on individual difference of an input/output buffer after completion of an LSI.

For example, to properly read/write data from/into a memory having a data transfer rate in a Gbps band, it is needed to properly design a circuit portion including internal flip-flops for capturing data read from the memory and a circuit portion for outputting the data from the flip-flops in synchronization with a system clock signal. To determine an effective period of the synchronized data, a technique is known of calculating Round-Trip-Delay in which a clock signal outputted from a memory controller returns to the memory controller as a data strobe signal DQS via a memory (SDRAM) (for example, Patent Literature 1).

FIG. 1 is a circuit diagram showing a configuration of a semiconductor device described in Patent Literature 1 (Japanese Patent Application Publication (JP-P2007-280289A)). In Patent Literature 1, arrival times of clock signal signals CK and CK# and a data strobe signal DQS which are transmitted to a double data rate memory are acquired by utilizing a reflected wave on a transmission path, and an effective period of data synchronized based on the arrival times of the clock signal signals and the data strobe signal is determined. Thus, the effective period of data synchronized with a system clock signal is determined according to an actual mounting state and connection environments.

Patent Literature 2 (Japanese Patent Application Publication (JP-P2007-12166A)) describes a technique relating on a semiconductor device which can adjust a difference between propagation characteristics due to individual difference or environmental difference. Patent Literature 3 (Japanese Patent Application Publication (JP-P2008-52335A)) describes a technique relating to an interface circuit for receiving a strobe signal outputted from a semiconductor device such as a memory and an LSI and a data signal synchronized with the strobe signal and adjusting a phase shift amount of the strobe signal for latching the data signal.

According to a conventional technique, a delay time is measured and the delay time is adjusted based on the measured result. However, according to the conventional technique, delays of a clock signal and a data strobe signal are measured by utilizing reflection on their transmission lines. For this reason, only the arrival times on the transmission lines and a delay of an input buffer on the side of an interface can be measured, and measurement cannot be performed in consideration of fixed delay amounts of the output buffers on a memory side and the interface side and jitter as a change amount at a normal read operation.

Since delay times of the output buffer and the memory cannot be measured, there is a case that synchronization with the internal system clock signal cannot be attained because of an unexpected large change of the delay times. Thus, an error in the system occurs. In this case, redesign of the transmission line and the I/O buffer is needed.

Moreover, a delay time of the clock signal and a delay time of the data strobe signal are separately measured. Thus, a measurement error of the delay time is sometimes regarded to be doubled.

SUMMARY OF THE INVENTION

In an aspect of the present invention, a memory interface circuit includes a clock signal supply buffer configured to send a system clock signal which is supplied through a reference node, to a memory through a transmission line; a data strobe buffer configured to receive a data strobe signal supplied from the memory; a system clock synchronizing circuit configured to supply a data read from the memory to a logic circuit in synchronization with the system clock signal; and a delay detecting circuit provided at a front stage to the system clock synchronizing circuit and configured to detect a transmission delay from the clock signal supply buffer to the data strobe buffer. The delay detecting circuit generates a phase difference data indicating the transmission delay based on a difference between a phase of the system clock signal and a phase of the data strobe signal outputted from the data strobe buffer, and supplies the phase difference data to the system clock synchronizing circuit. The system clock synchronizing circuit generates a read clock signal by shifting the system clock signal based on the phase difference data, and controls a supply timing at which the data is supplied to the logic circuit, based on the read clock signal.

In another aspect of the present invention, an operation method of a memory interface circuit is achieved by transmitting a system clock signal which is supplied through a reference node, to a memory via a clock signal supply buffer; by receiving a data strobe signal which is supplied from the memory by a data strobe buffer; by detecting a transmission delay from the clock signal supply buffer to the data strobe buffer by a delay detecting circuit provided at a front-stage of the system clock synchronizing circuit; by synchronizing data read from the memory with the system clock signal by the system clock synchronizing circuit to supply to logic circuit. The detecting is achieved by generating a phase difference data indicating the transmission delay based on a difference between a phase of the system clock signal and a phase of the data strobe signal outputted from the data strobe buffer; and by supplying the phase difference data to the system clock synchronizing circuit. The synchronizing is achieved by generating a read clock signal by shifting the system clock signal based on the phase difference data; and by controlling a supply timing at which the data is supplied to the logic circuit based on the read clock signal.

In still another aspect of the present invention, an information processing apparatus includes a memory module configured to operate in synchronization with a memory clock signal; a logic circuit configured to operate in synchronization with a system clock signal; and a memory interface circuit provided between the memory module and the logic circuit. The memory interface circuit includes a clock signal supply buffer configured to send the system clock signal which is supplied through a reference node, to the memory module through a transmission line; a data strobe buffer configured to receive a data strobe signal supplied from the memory module; a system clock synchronizing circuit configured to supply data read from the memory module to the logic circuit in synchronization with the system clock signal; and a delay detecting circuit provided at a front stage to the system clock synchronizing circuit and configured to detect a transmission delay from the clock signal supply buffer to the data strobe buffer. The delay detecting circuit generates a phase difference data indicating the transmission delay based on a difference between a phase of the system clock signal and a phase of the data strobe signal outputted from the data strobe buffer, and supplies the phase difference data to the system clock synchronizing circuit. The system clock synchronizing circuit generates a read clock signal by shifting the system clock signal based on the phase difference data, and controls a supply timing at which the data is supplied to the logic circuit, based on the read clock signal.

According to the present invention, when a memory module and a memory interface are mounted on a board, a data strobe signal DQS can be synchronized with a system clock signal SCLK without depending on a flight time (propagation time) of a signal which varies based on a state of wirings on the board.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF PREFERRED EMBODIMENTS

Figure 1:
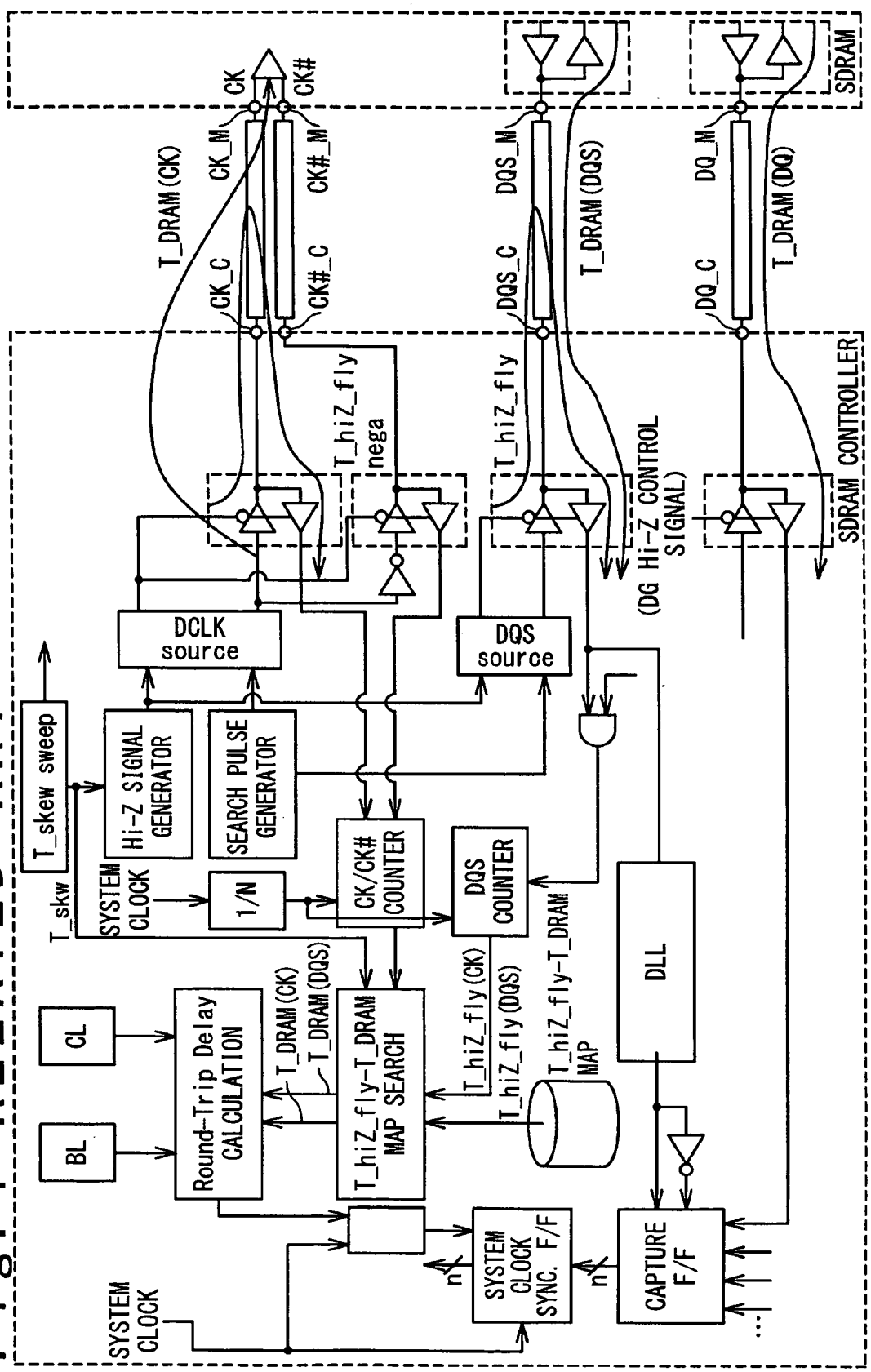
FIG. 1 is a circuit diagram showing a configuration of a conventional semiconductor device.

Hereinafter, a memory interface of the present invention will be described with reference to the attached drawings. In the drawings, a same reference numeral is assigned to a same member and redundant description is omitted.

Figure 2:
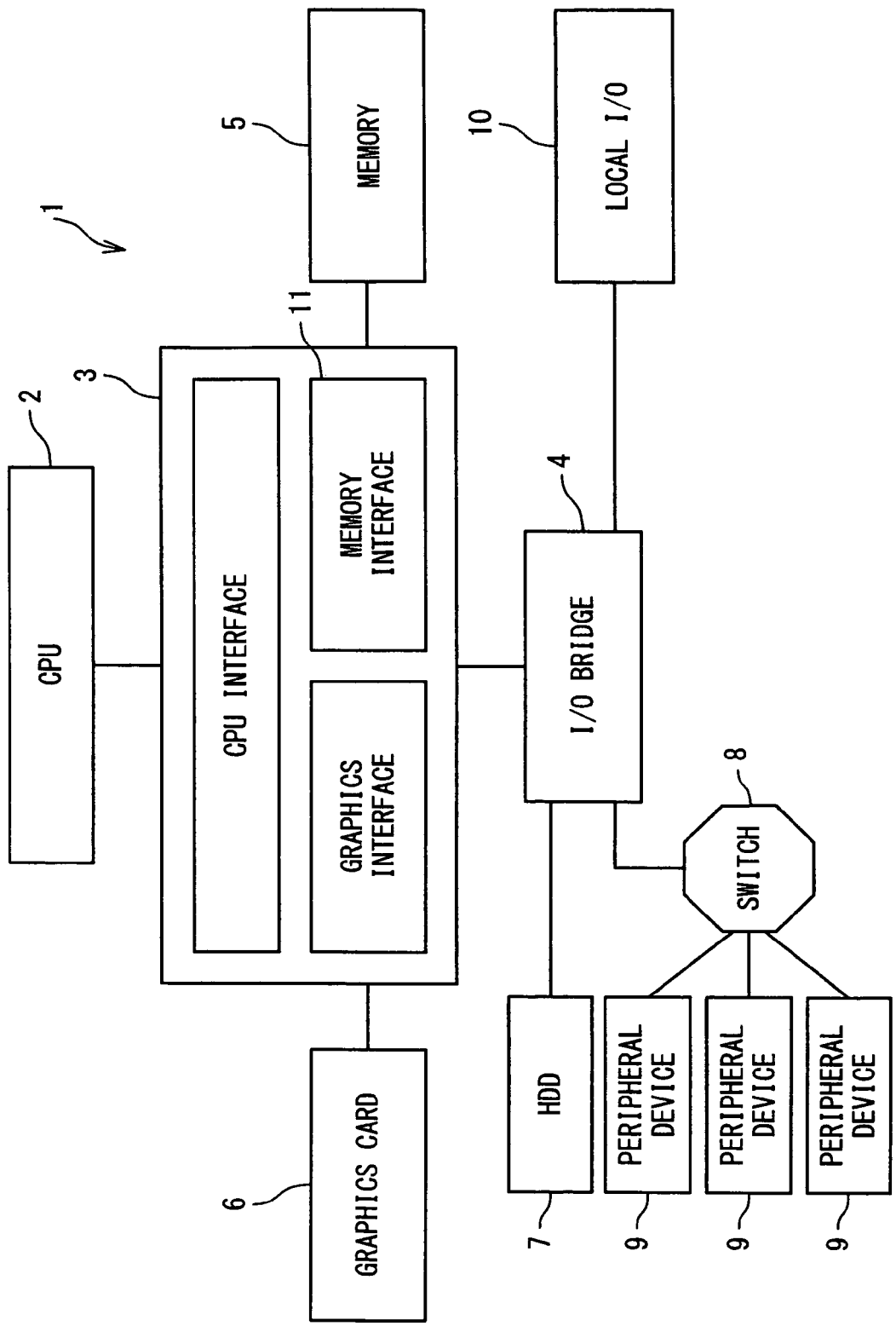
FIG. 2 is a block diagram showing a configuration of a computer system according to an embodiment of the present invention.

FIG. 2 is a block diagram showing a configuration of a computer system 1 in which a memory interface 11 in the present embodiment is mounted. The computer system 1 is an information processing system which supports a chip set including the memory interface 11 and can perform functions such as inputting, outputting, storage, calculation and control. The computer system 1 includes a CPU 2, a memory bridge 3, an I/O bridge 4, a memory 5, a graphics card 6, an HDD 7, a switch 8, a peripheral device 9 and a local I/O 10.

The CPU 2 is a central processing unit provided in an information processing system main body forming the computer system 1 in the present embodiment. The CPU 2 performs control of various devices provided in the computer system 1 and data processing. The CPU 2 interprets and calculates data received from an input device (not shown) and outputs calculation results to an output device (not shown).

The memory bridge 3 is also called as a north bridge and interconnects the CPU 2 and the memory 5 to bridge data. The memory bridge 3 interconnects the CPU 2 and an extension bus to bridge data. The I/O bridge 4 is called as a south bridge, coordinates various I/O controllers and bridges data with the extension bus.

The memory 5 is called as a main memory unit (main memory) and stores data and a program in the computer system 1. The memory 5 has a region in which the CPU (central processing unit) can directly read and write data. In the following embodiment, the memory 5 is a high-speed semiconductor memory device such as DDR3 SDRAM.

The graphics card 6 is a circuit board for displaying a data on an output unit (for example, liquid crystal display) of the computer system 1. The graphics card 6 is connected to the CPU 2 through the memory bridge 3 and supplies a screen display to the user in response to a command from the CPU 2. The HDD 7 is an auxiliary memory which can continue to hold information therein even after power is turned OFF. In the computer system 1 in the present embodiment, a nonvolatile semiconductor memory device such as a flash memory, in addition to the HDD 7, may be used as an auxiliary storage device. The peripheral device 9 is an external input/output unit connected to the I/O bridge 4 through the switch 8. The local I/O 10 is a peripheral device inherent to the computer system 1.

As shown in FIG. 2, the memory bridge 3 includes the memory interface 11, a CPU interface and a graphic interface. The memory interface 11 is connected to the memory 5 and controls write of data into the memory 5 and read of data from the memory 5. The CPU interface is connected to the CPU 2 and serves to receive a command from the CPU 2 and supply data to the CPU 2. The graphic interface is connected to the graphics card 6 and controls supply of image data to the graphics card 6.

Figure 3:
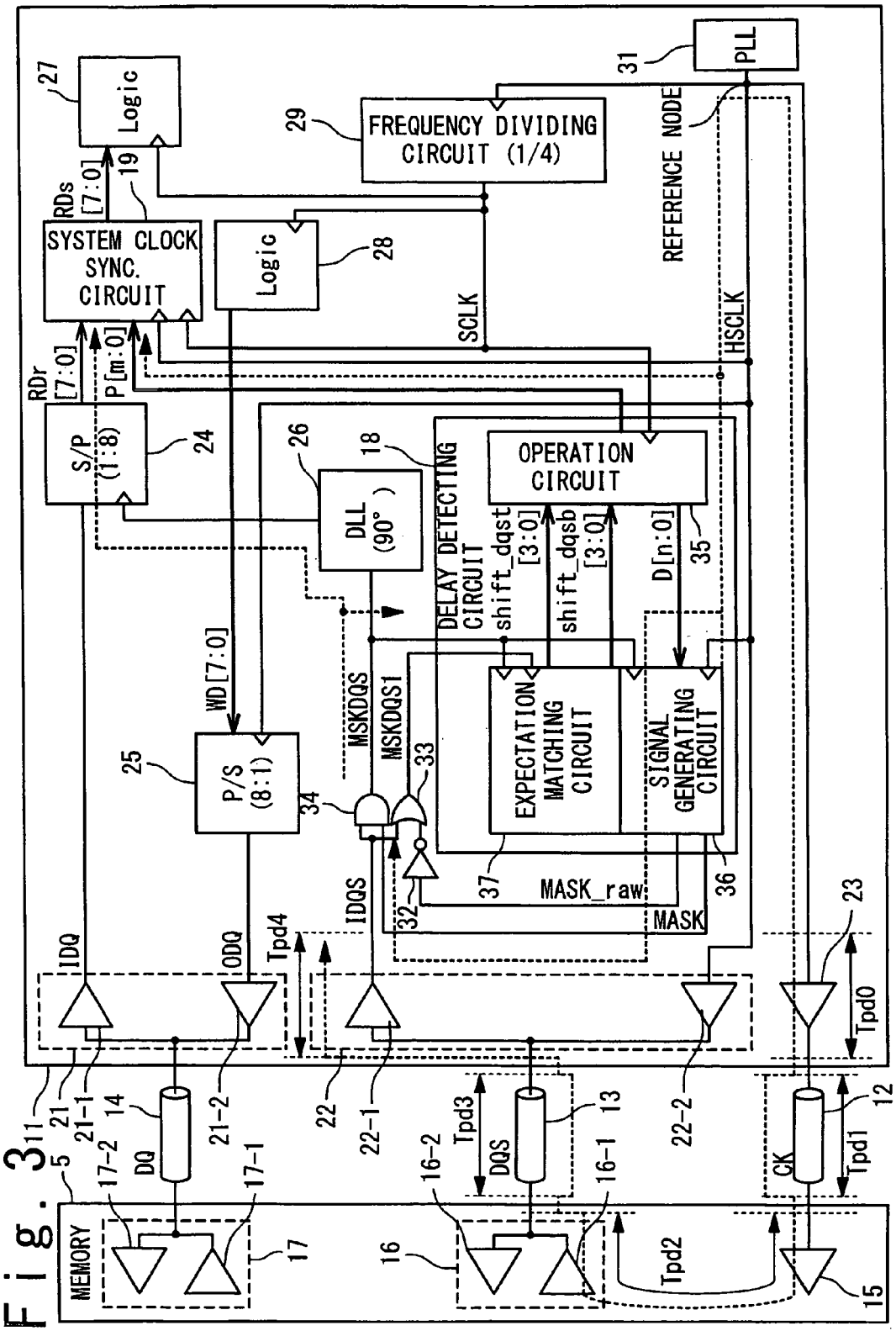
FIG. 3 is a circuit diagram showing a configuration of a memory interface and a memory in the present embodiment.

FIG. 3 is a circuit diagram showing a configuration of the memory interface 11 and the memory 5 connected to the memory interface 11 in the present embodiment. The memory interface 11 is connected to the memory 5 through transmission lines. The transmission lines are configured so as to properly perform data communication between the memory 5 and the memory interface 11.

A clock transmission line 12 transfers a clock signal CK from the memory interface 11 to the memory 5. A data strobe transmission line 13 transfers the data strobe signal DQS between the memory 5 and the memory interface 11. A data transmission line 14 transfers a data signal DQ between the memory 5 and the memory interface 11.

The memory 5 includes a clock signal buffer 15, a data strobe transmitting/receiving circuit 16 and a data transmitting/receiving circuit 17. The clock signal buffer 15 supplies the clock signal CK to the inside of the memory 5 through the clock signal transmission line 12.

The data strobe transmitting/receiving circuit 16 includes a first data strobe buffer 16-1 and a second data strobe buffer 16-2. The first data strobe buffer 16-1 supplies the data strobe signal DQS from the memory 5 to the memory interface 11 through the data strobe transmission line 13. The second data strobe buffer 16-2 supplies the data strobe signal DQS from the memory interface 11 to the memory 5 through the data strobe transmission line 13.

The data transmitting/receiving circuit 17 includes a first data buffer 17-1 and a second data buffer 17-2. The first data buffer 17-1 supplies the data signal DQ from the memory 5 to the memory interface 11 through the data transmission line 14. The second data buffer 17-2 supplies the data signal DQ from the memory interface 11 to the memory 5 through the data transmission line 14.

The memory interface 11 includes a delay detecting circuit 18, a system clock synchronizing circuit 19, a serial/parallel converting circuit 24, a parallel/serial converting circuit 25, a DLL circuit 26, a logic circuit 27, a logic circuit 28, a frequency dividing circuit 29, a PLL circuit 31, an inverter 32, a first OR circuit 33 and a first AND circuit 34.

The delay detecting circuit 18 includes a signal generating circuit 36, an expectation matching circuit 37 and an operation circuit 35. The delay detecting circuit 18 is connected to an input end of the inverter 32 and an input of the first AND circuit 34. An output end of the inverter 32 is connected to an input of the first OR circuit 33. An output of the first AND circuit 34 and an output of the first OR circuit 33 are connected to the delay detecting circuit 18.

The delay detecting circuit 18 receives a first mask data strobe MSKDQS supplied from the first AND circuit 34 and a second mask data strobe MSKDQS1 supplied from the first OR circuit 33. The delay detecting circuit 18 is connected to the PLL 31. The delay detecting circuit 18 receives a high speed clock signal HSCLK supplied from the PLL 31. The delay detecting circuit 18 is connected to the system clock synchronizing circuit 19 and supplies a result of delay detection to the system clock synchronizing circuit 19.

The system clock synchronizing circuit 19 includes a circuit such as Elastic Buffer. The system clock synchronizing circuit 19 is connected to the delay detecting circuit 18, the serial/parallel converting circuit 24, the frequency dividing circuit 29, the PLL 31 and the logic part 27. The serial/parallel converting circuit 24 converts the data signal IDQ (serial data) transmitted from the memory 5 into parallel data and supplies the parallel data to the system clock synchronizing circuit 19. The system clock synchronizing circuit 19 receives a system clock signal SCLK and the high speed clock signal HSCLK. The system clock synchronizing circuit 19 synchronizes an initial read data RDr supplied from the serial/parallel converting circuit 24 with the system clock signal SCLK based on a result of delay detection by the delay detecting circuit 18.

The parallel/serial converting circuit 25 converts parallel data transmitted from the logic circuit 28 into a data signal ODQ of serial data. The DLL circuit 26 is connected to the output of the first AND circuit 34 and controls a phase of the first mask data strobe MSKDQS supplied from the first AND circuit 34, and then, supplies the first mask data strobe MSKDQS to the serial/parallel converting circuit 24. The logic circuit 27 is connected to the system clock synchronizing circuit 19 and the frequency dividing circuit 29 and receives data supplied from the system clock synchronizing circuit 19 in synchronization with the system clock signal SCLK.

The memory interface 11 includes a data transmitting/receiving circuit 21, a data strobe transmitting/receiving circuit 22 and the clock signal buffer 23. The data transmitting/receiving circuit 21 includes a first data buffer 21-1 and a second data buffer 21-2. The first data buffer 21-1 receives the data signal DQ transmitted from the memory 5 through the data transmission line 14 and supplies the data signal IDQ to the serial/parallel converting circuit 24. The second data buffer 21-2 transmits the data signal ODQ supplied from the parallel/serial converting circuit 25 to the memory 5 through the data transmission line 14.

The data strobe transmitting/receiving circuit 22 includes a first data strobe buffer 22-1 and a second data strobe buffer 22-2. The first data strobe buffer 22-1 receives the data strobe signal IDQS transmitted from the memory 5 through the data strobe transmission line 13 and supplies the data strobe signal IDQS to the first AND circuit 34. The second data strobe buffer 22-2 transmits the high speed clock signal HSCLK supplied from the PLL circuit 31 to the memory 5 through the data strobe transmission line 13.

The clock signal buffer 23 transmits the high speed clock signal HSCLK supplied from the PLL circuit 31 as the clock signal CK to the memory 5 through the clock signal transmission line 12. The clock signal buffer 23 has a propagation delay time Tpd0 of a signal in the clock signal buffer 23 from an input to an output. The clock signal transmission line 12 has a propagation delay time Tpd1 of the signal transmitted on the clock signal transmission line 12. A path including between the clock signal buffer 15 and the first data strobe buffer 16-1 has a propagation delay time Tpd2 in a path from an input of the clock signal buffer 15 to an output of the first data strobe buffer 16-1. The data strobe transmission line 13 has a propagation delay time Tpd3 of a signal transmitted on the data strobe transmission line 13. The first data strobe buffer 22-1 has a propagation delay time Tpd4 of a signal transmitted on a path from an input to an output of the first data strobe buffer 22-1.

Figure 4:
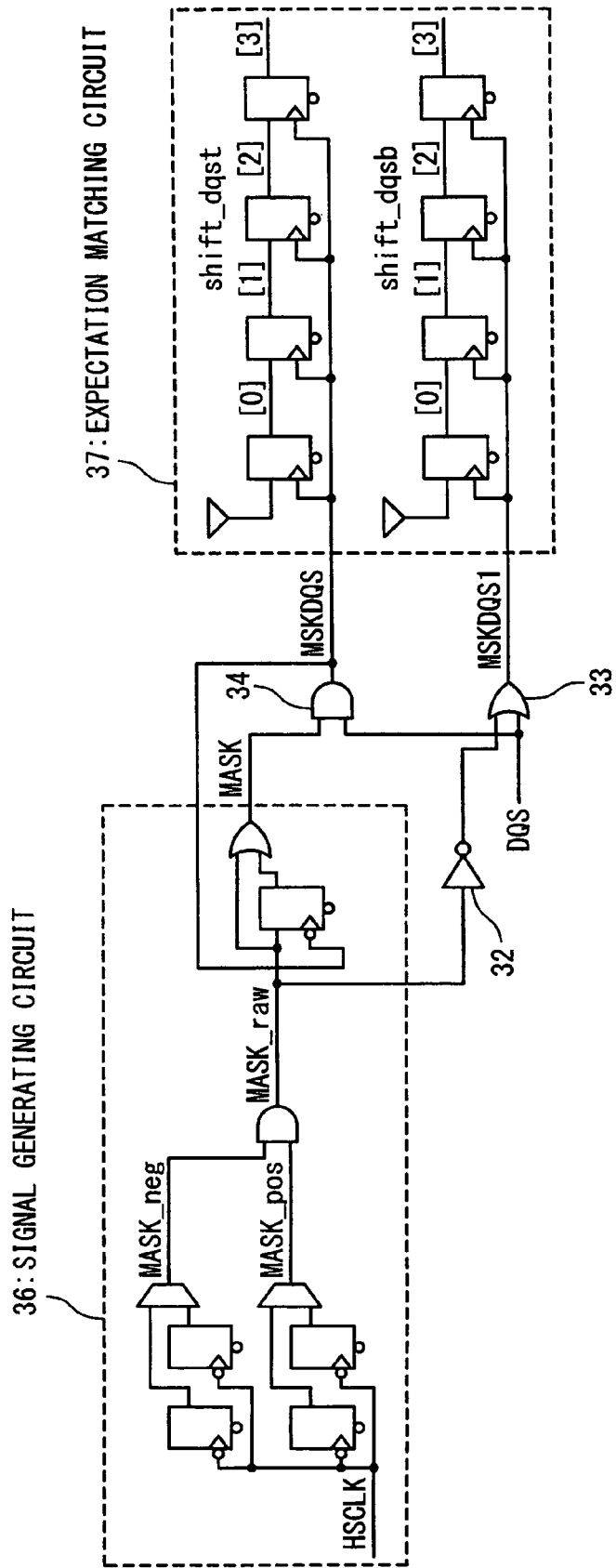
FIG. 4 is a block diagram showing a configuration of a signal generating circuit and an expectation matching circuit in a delay detecting circuit shown in FIG. 3.

FIG. 4 is a block diagram showing a configuration of the signal generating circuit 36 and the expectation matching circuit 37 in the delay detecting circuit 18. As shown in FIG. 4, the signal generating circuit 36 generates a reference mask signal generating command MASK_neg and an inverted reference mask signal generating command MASK_pos based on the high speed clock signal HSCLK and an external command. The signal generating circuit 36 generates a reference mask signal MASK_raw and a mask signal MASK based on the reference mask signal generating command MASK_neg and the inverted reference mask signal generating command MASK_pos. The signal generating circuit 36 supplies the reference mask signal MASK_raw to the inverter 32 in a previous stage of the first OR circuit 33. Also, the signal generating circuit 36 supplies the mask signal MASK to the first AND circuit 34.

The first AND circuit 34 outputs the first mask data strobe MSKDQS in response to the mask signal MASK and the data strobe signal DQS supplied from the first data strobe buffer 22-1. The first OR circuit 33 outputs the second mask data strobe MSKDQS1 in response to an inverted reference mask signal MASK_raw and the data strobe signal DQS supplied from the first data strobe buffer 22-1.

The expectation matching circuit 37 includes a first shift register and a second shift register. The first shift register holds a value based on the first mask data strobe MSKDQS and outputs the held value as a shift data strobe shift_dqst. The second shift register holds a value based on the second mask data strobe MSKDQS1 and outputs the held value as an inverted shift data strobe shift_dqsb.

Figure 5:
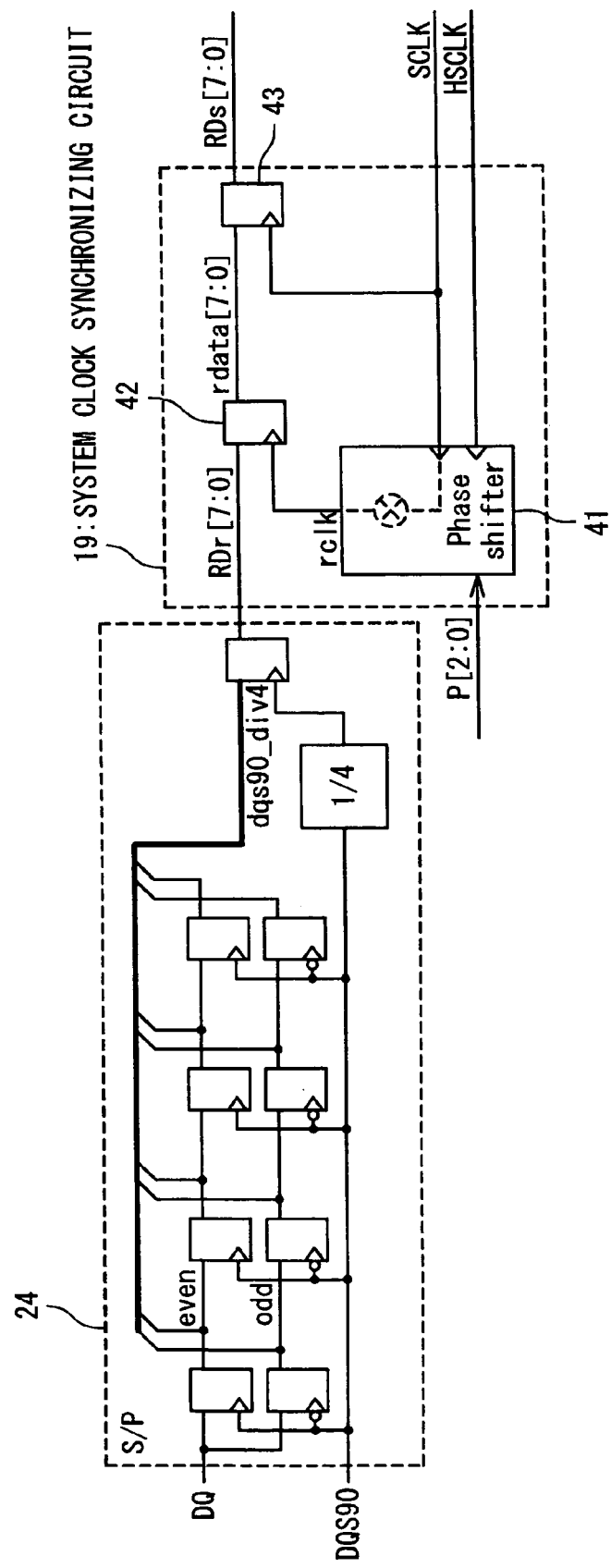
FIG. 5 is a block diagram showing a configuration of a system clock synchronizing circuit shown in FIG. 3.

FIG. 5 is a block diagram showing a configuration of the system clock synchronizing circuit 19. The system clock synchronizing circuit 19 is disposed in a following stage of the serial/parallel converting circuit 24 and receives parallel data supplied from the serial/parallel converting circuit 24. As shown in FIG. 5, the system clock synchronizing circuit 19 includes a phase shifter 41, a first data holding circuit 42 and a second data holding circuit 43. The first data holding circuit 42 latches the initial read data RDr supplied from the serial/parallel converting circuit 24 in response to a read clock signal rclk. The second data holding circuit 43 latches the data held in the first data holding circuit 42 in response to the system clock signal SCLK. The phase shifter 41 generates the read clock signal rclk to be supplied to the first data holding circuit 42. The phase shifter 41 generates the read clock signal rclk based on a result of delay detection by the delay detecting circuit 18.

Figure 6:
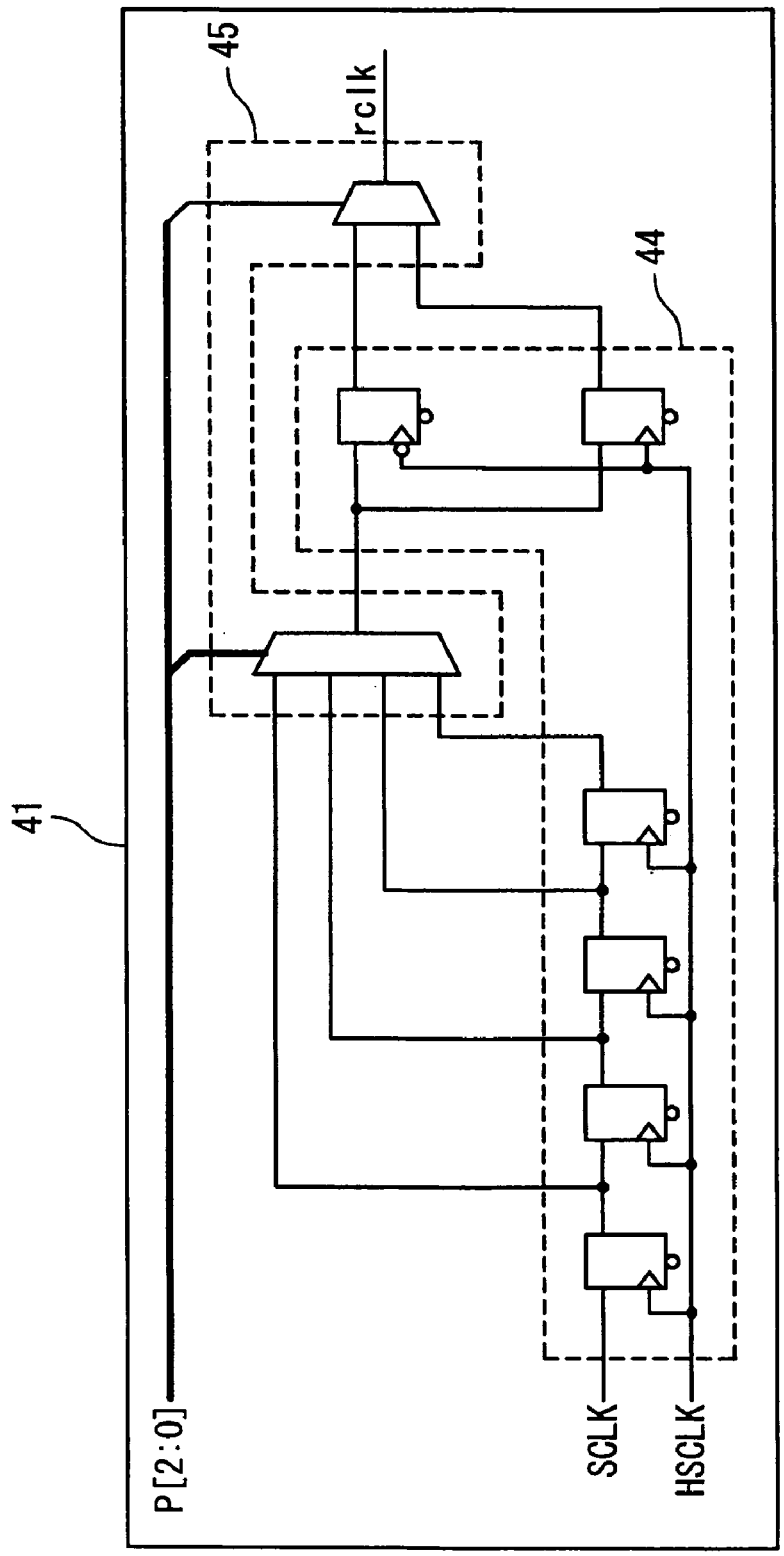
FIG. 6 is a block diagram showing a configuration of a phase shifter shown in FIG. 5.

FIG. 6 is a block diagram showing a configuration of the phase shifter 41. The phase shifter 41 includes a register group 44 and a selector group 45. As shown in FIG. 6, the phase shifter 41 converts the result of delay detection by the delay detecting circuit 18 into a phase shift amount with respect to the system clock signal SCLK and shifts the read clock signal rclk to a position which satisfies Setup and Hold.

Figure 7:
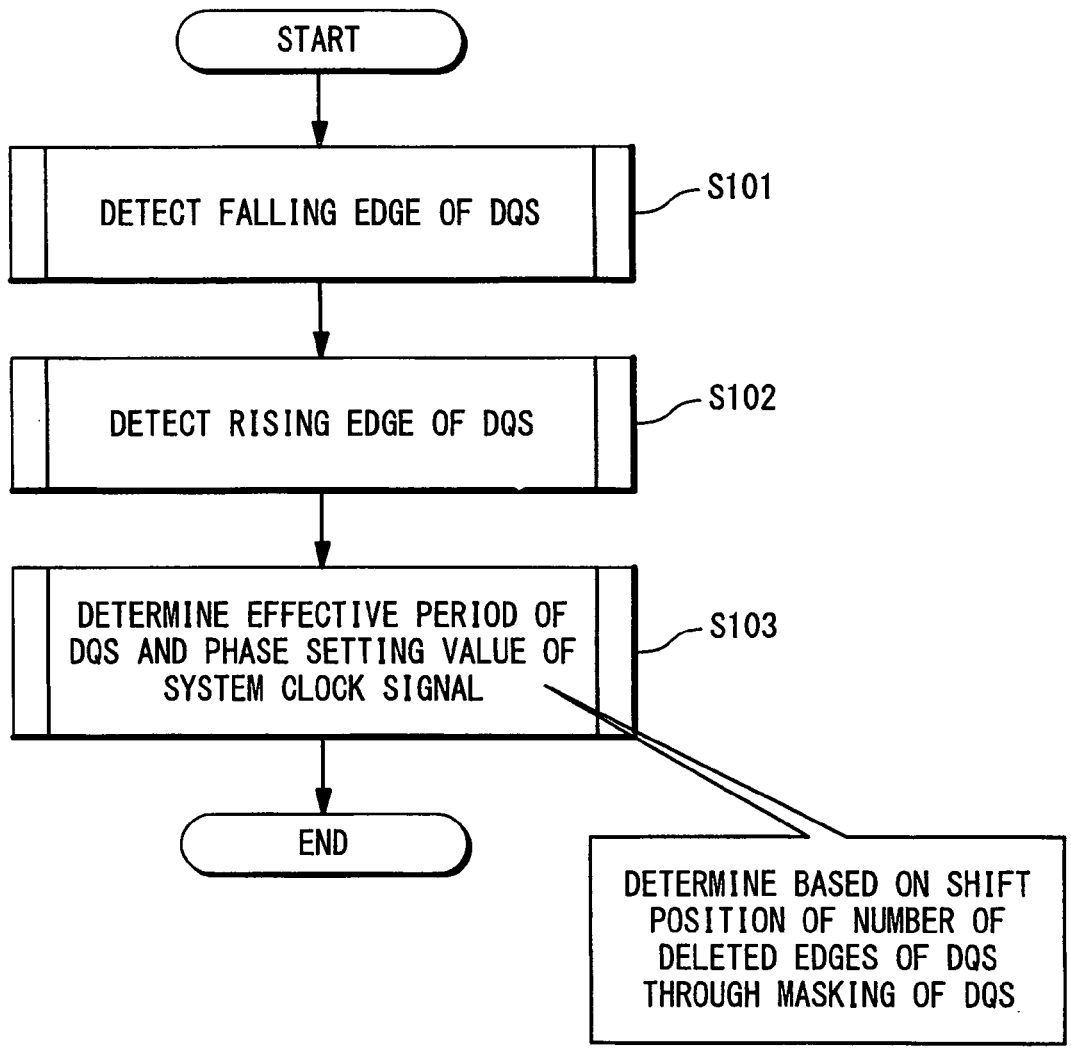
FIG. 7 is a flow chart schematically showing an operation of the memory interface in the present embodiment.

FIG. 7 is a flow chart schematically showing an operation of the memory interface 11 in the present embodiment. As shown in FIG. 7, at Step S101, a first Falling Edge of the data strobe signal DQS is detected. At Step S102, a last Rising Edge of the data strobe signal DQS (effective period of the data strobe signal DQS) is searched.

Figure 8:
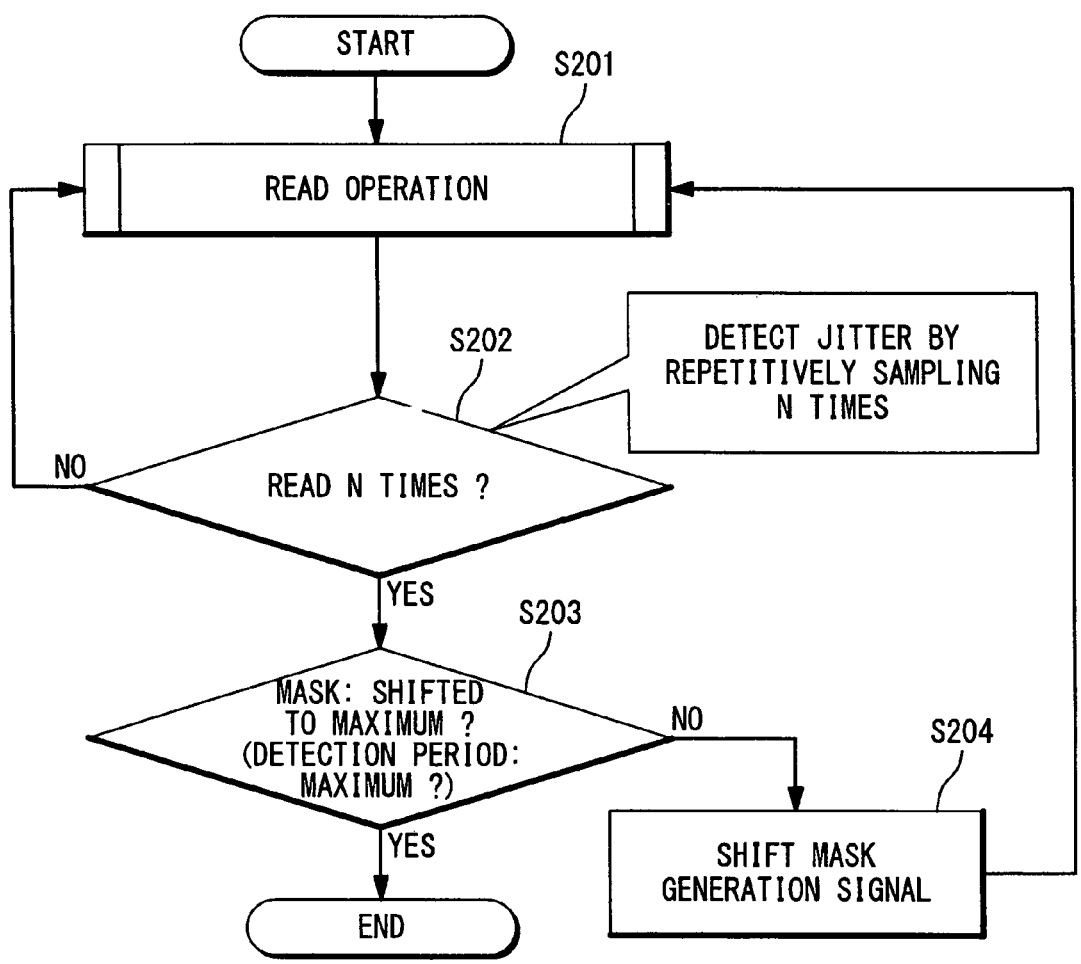
FIG. 8 is a flow chart showing an operation at Step S101 or Step S102 in FIG. 7.

FIG. 8 is a flow chart showing an operation at Step S101 and Step S102 in detail. As shown at S201 in FIG. 8, using the mask signal MASK shifted by the high speed clock signal HSCLK, a Read operation is performed at a same shift position. At Step S202, it is determined whether or not the Read operation is repeated N times during a jitter measurement time which is defined by a standard. When it is determined that the Read operation is performed N times during the jitter measurement time, it is determined whether the shift operation of the mask signal MASK has been completed (Step S203, S204). When the shift operation of the mask signal MASK has been completed, the control flow proceeds to Step S103 in FIG. 7.

Returning to FIG. 7, at Step S103, a phase difference between the data strobe signal DQS and the system clock signal SCLK is determined. An operation at Step S103 is performed based on a change of the number of edges of the data strobe signal DQS (the number of disappearance) when masking of the data strobe signal DQS, and the shift position. Thus, the system clock synchronizing circuit 19 can set a delivery time to the system clock signal to be minimum in consideration of the jitter, while satisfying Setup/Hold. For this reason, a response time of the system to Read request can be securely minimized.

Figure 9:
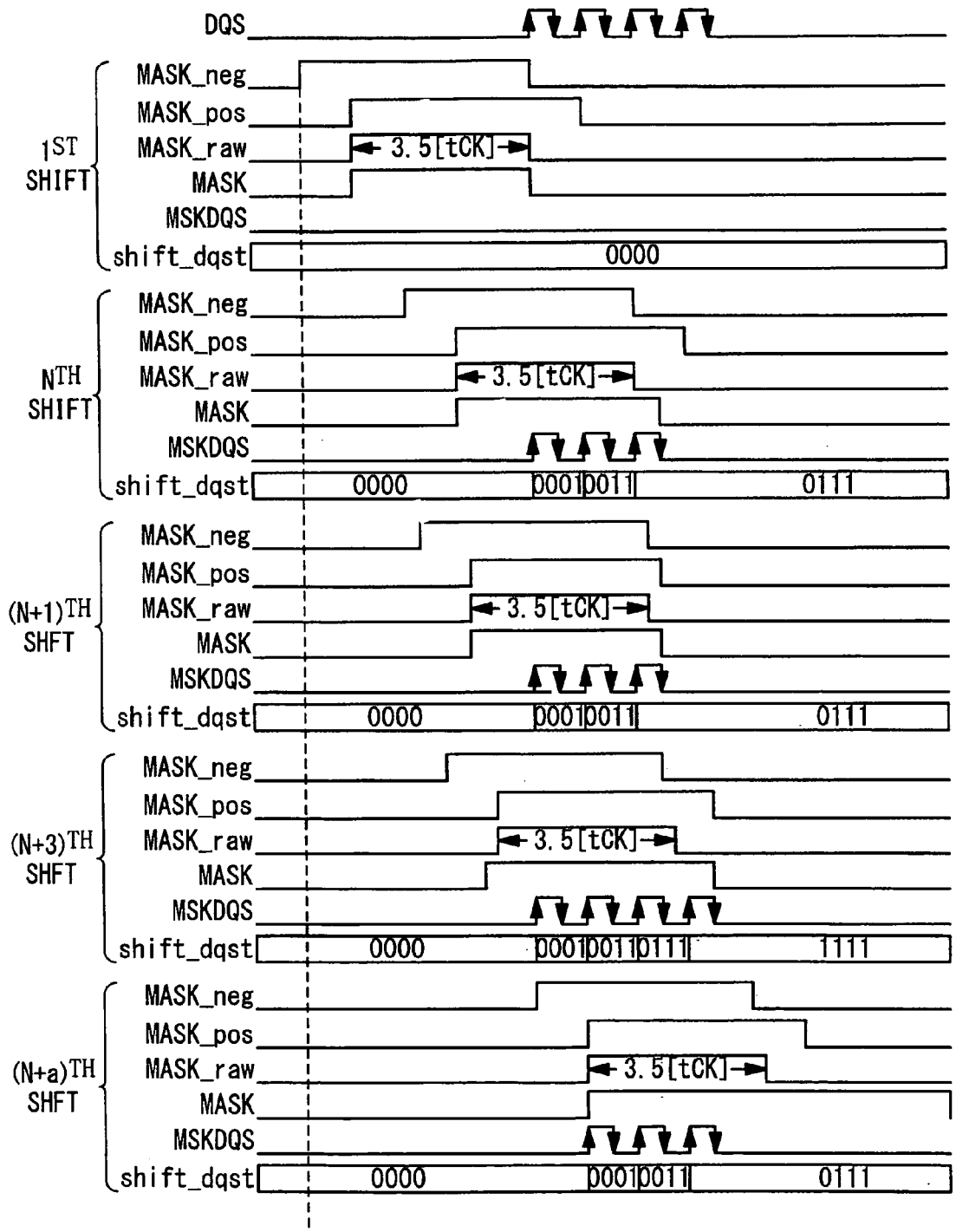
FIG. 9 is a diagram showing timing charts of an operation of detecting falling edge of a data strobe signal DQS.

FIG. 9 is a diagram showing timing charts of an operation of detecting Falling edge of the data strobe signal DQS. As shown in FIG. 9, the mask signal MASK is shifted while repeating Read request in one burst. In response to the shift operation of the mask signal MASK, the Falling edge of the DQS is detected and a start position of the mask signal MASK is determined at intervals of the high speed clock signal HSCLK as the system clock signal.

The number of Falling edges is counted by a value of the first shift register of the expectation matching circuit 37 (shift_dqst [3:0]). Referring to FIG. 9, an initial value of the shift register value is "0000" at the initial position of the mask signal MASK. At this time, "1" is set to holding circuits of the first shift register in response to each pulse of the data strobe signal DQS during the effective mask signal MASK. Thus, a position at which the shift register value changes from "0111" to "1111" is determined as a start position of the mask signal MASK.

Figure 10:
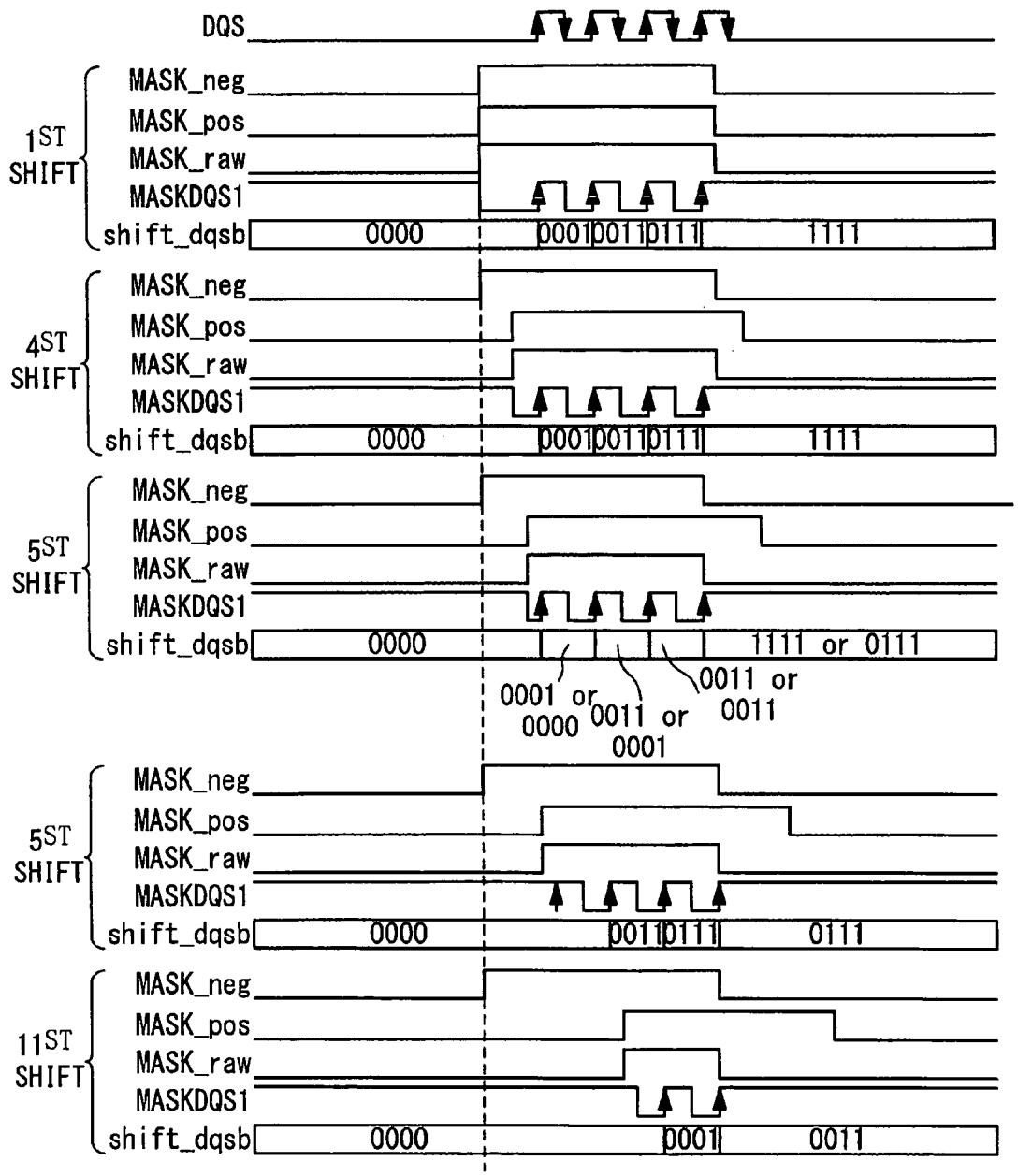
FIG. 10 is a diagram showing timing charts of an operation of detecting rising edge of the data strobe signal DQS.

FIG. 10 is a diagram showing timing charts of an operation of detecting the rising edge of the data strobe signal DQS. As shown in FIG. 10, as in the operation of detecting the Falling edge, the Rising edge of data strobe signal DQS is detected. A release position of the mask signal MASK is determined at intervals of the high speed clock signal HSCLK as the system clock signal. The release position of the mask signal MASK is located at a position previous for one pulse (0.5 tCK) from a position at which the value of the second shift register of the expectation matching circuit 37 (shift_dqsb[3:0]) changes from "1111" to "0111".

Figure 11:
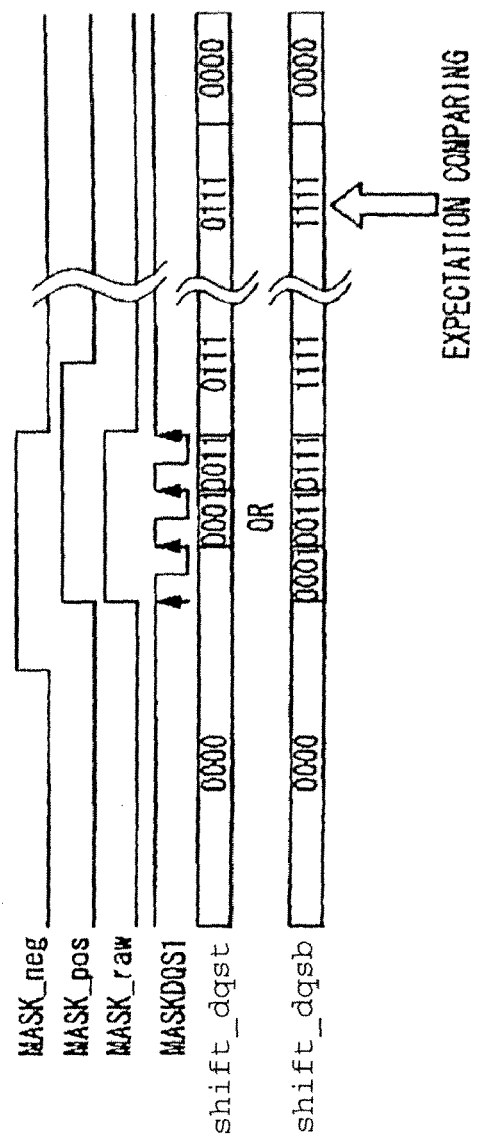
FIG. 11 is a diagram showing timing charts of an operation of expectation matching.

FIG. 11 is a diagram showing timing charts of an expectation matching operation performed during the above-mentioned detection of the Rising Edges and the Falling Edges. As described above, in the present embodiment, in detecting the Rising Edges and the Falling Edges of the data strobe signal DQS, the Read operation is repeated N times (N is the number corresponding to the jitter measuring time defined by the standard) in one shift operation. For example, in DDR3 SDRAM, the Read operation is performed 200 times which are defined. At this time, the expectation matching is performed, the expectation of the shift_dqst [3:0] and the expectation of the shift_dqsb [3:0] are matched and an indefinite zone during which the expectations are obtained or not due to a jitter factor is removed.

Figure 12:
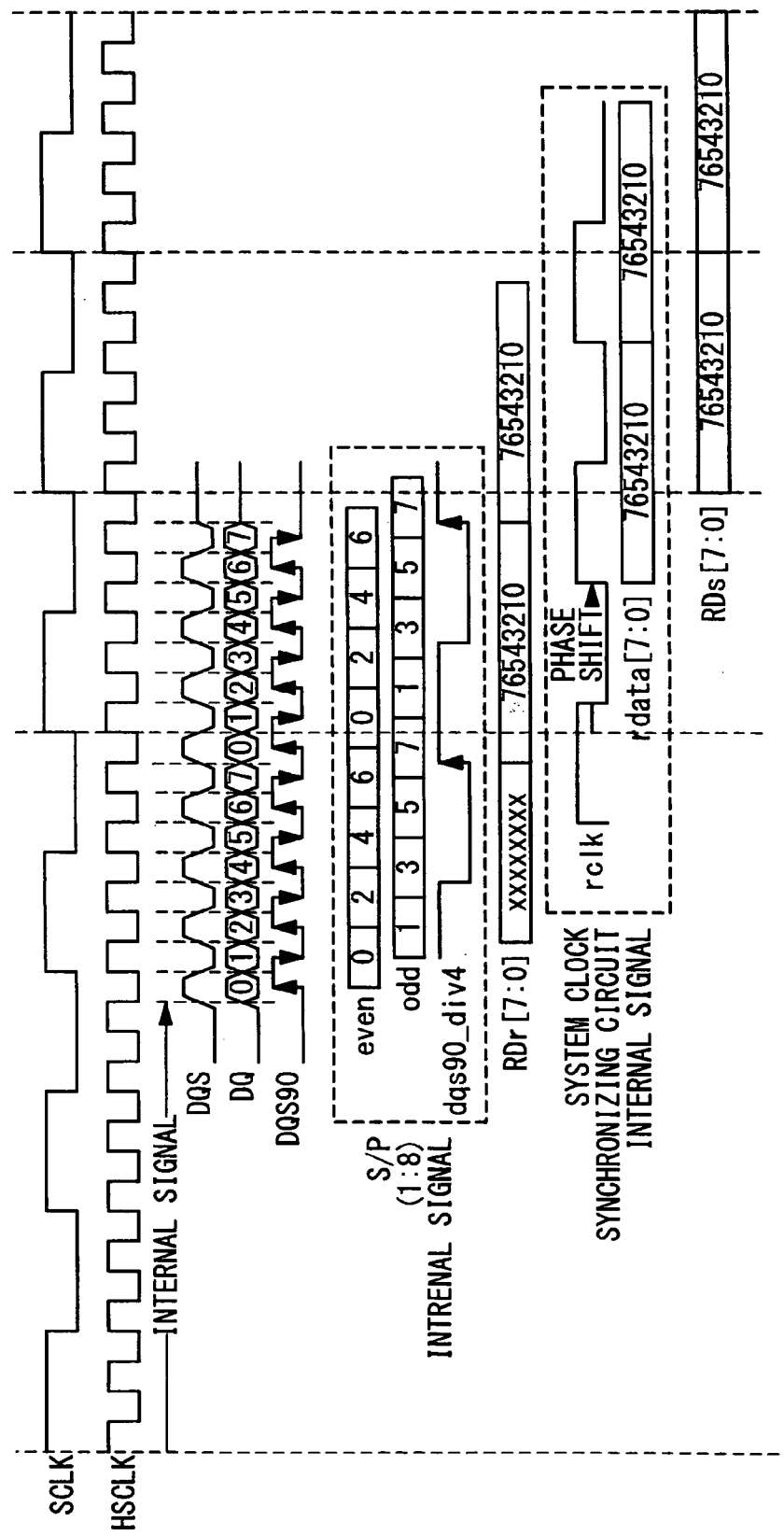
FIG. 12 is a diagram showing timing charts of an operation of reading data.

FIG. 12 is a diagram showing timing charts of an operation of reading data by the memory interface 11 in the present embodiment. As described above, an effective period of the data strobe signal DQS in the mask signal MASK of one burst is determined based on two measurement results of a first Rising position of the data strobe signal DQS and a last Falling position of the data strobe signal DQS. Referring to FIG. 12, based on the effective period of the data strobe signal DQS, phase difference data P[n:0] is specified which represents a phase difference between the system clock signal SCLK and output timing of data of the serial/parallel converting circuit 24 in a clock signal domain of the data strobe signal DQS. This value is converted into a phase shift amount with respect to the system clock signal SCLK of the system clock synchronizing circuit 19 and shifts the read clock signal rclk at the position which satisfies Setup and Hold. According to the read clock signal rclk, data converted in parallel in the data strobe signal DQS domain (initial read data RDr [7:0]) is latched and data received in synchronization with the system clock signal SCLK (read data RDs [7:0]) is generated.

COMPARISON EXAMPLE

Figure 13:
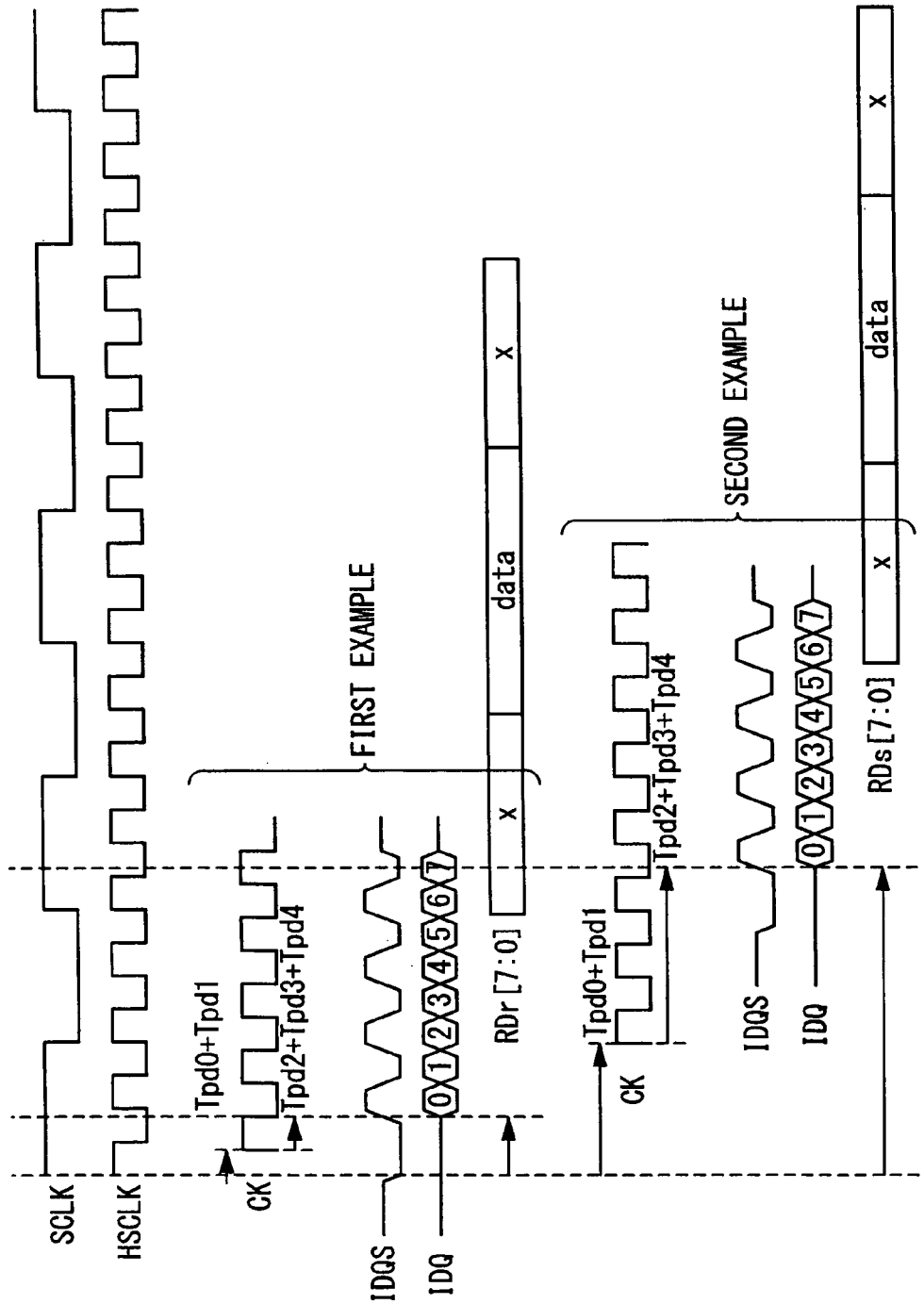
FIG. 13 is a diagram showing timing charts of an operation of the memory interface without applying configuration in the present embodiment.

A comparison example for facilitating understanding of the present embodiment will be described below. FIG. 13 is a diagram showing timing charts of an operation of the memory interface without applying a configuration in the present embodiment. FIG. 13 shows the operation in a case where ideal implementation is made and the operation in a case where non-ideal implementation is made.

The timing charts corresponding to a first implementation shows an ideal operation of reading data. For example, in the case where a delay time of an IO buffer (the propagation delay time Tpd0 or the propagation delay time Tpd4) and a delay time (the propagation delay time Tpd1 or the propagation delay time Tpd3) in a transmission line, or a delay time due to response of a memory (for example, the propagation delay time Tpd2) is short, the operation in the timing charts is performed. Referring to FIG. 13, in an ideal operation of reading data, response to data read is finished within 1[tCK].

However, an ideal data reading operation may not be performed due to implementation of LSI. The timing charts corresponding to a second implementation show a non-ideal operation of reading data. For example, in the case where the delay time of the IO buffer (the propagation delay time Tpd0 or the propagation delay time Tpd4), the delay time (the propagation delay time Tpd1 or the propagation delay time Tpd3) in the transmission line, or the delay time due to response of the memory (for example, the propagation delay time Tpd2) is long, the operation in the timing charts is performed. Referring to FIG. 13, in this case, even when the system clock signal exceeds one cycle, response to data read is not finished.

By applying the memory interface 11 in the present embodiment, the above-mentioned disadvantage can be solved. In the memory interface 11, in the case where a reference node is defined in the following stage of the PLL circuit, the delay detecting circuit 18 built in an interface side detects a delay in a path from a reference node thereof to an output node from which the first mask data strobe MSKDQS is outputted. Thus, Flight Time (transmission time) of a signal which varies depending on implementation such as a length of wiring on a board can be measured. Since the memory interface 11 makes read data synchronize with an internal clock signal based on the measurement result, setting to minimize the Read response time can be automatically performed.

Therefore, by performing a delay detection test flow prior to normal use, the memory interface 11 in the present embodiment can individually measure a transmission delay for each implementation and allow an internal circuit to address the delay value based on the measurement result. For this reason, it is no need to redesign the board, which is effective to reduce costs. Furthermore, by individually measuring the transmission delay for each implementation and allowing the internal circuit to address the delay value based on the measurement result, a grade of the memory of an initial design can be changed at mass production. Furthermore, the memory interface 11 in the present embodiment takes a jitter component such as random jitter into consideration. For this reason, an excessive margin at design is unnecessary, which is effective to simplify a system design of a DDR interface.

A memory interface in the present embodiment controls read/write of data from/into a memory in response to a data strobe signal. The memory interface is applied to any device without limitation as long as a memory mounted in the device is compatible with the data strobe signal.

The embodiments of the present invention have been specifically described. The present invention is not limited to the above-mentioned embodiments and may be variously modified so as not to deviate from the subject matter.

What is claimed is:

1. A memory interface circuit comprising:
    a clock signal supply buffer configured to send a system clock signal which is supplied through a reference node, to a memory through a transmission line;
    a data strobe buffer configured to receive a data strobe signal supplied from said memory;
    a system clock synchronizing circuit configured to supply a data read from said memory to a logic circuit in synchronization with said system clock signal; and
    a delay detecting circuit provided at a front stage to said system clock synchronizing circuit and configured to detect a transmission delay from said clock signal supply buffer to said data strobe buffer,
    wherein said delay detecting circuit generates a phase difference data indicating said transmission delay based on a difference between a phase of said system clock signal and a phase of said data strobe signal outputted from said data strobe buffer, and supplies said phase difference data to said system clock synchronizing circuit,
    wherein said system clock synchronizing circuit generates a read clock signal by shifting said system clock signal based on said phase difference data, and controls a supply timing at which said data is supplied to said logic circuit, based on said read clock signal, and
    wherein said delay detecting circuit specifies a rising timing and a falling timing of said data strobe signal based on a mask signal which deactivates said data strobe signal, and generates said phase difference data based on an effective period of said data strobe signal which is determined based on the specified rising timing and the specified falling timing.

2. The memory interface circuit according to claim 1, wherein said delay detecting circuit comprises an operation circuit, a signal generating circuit, and an expectation matching circuit,
    wherein said signal generating circuit generates said mask signal and a reference mask signal as a reference of said mask signal in response to a mask signal generation instruction, and shifts said mask signal gradually to generate a shifted mask signal, and
    said expectation matching circuit specifies the falling timing of said data strobe signal based on a shift result when said data strobe signal is shifted based on a timing of said shifted mask signal.

3. The memory interface circuit according to claim 2, wherein said signal generating circuit shifts said reference mask signal gradually to generate a shifted reference mask signal, and
    said expectation matching circuit specifies the rising timing of said data strobe signal based on a shift result when said data strobe signal is shifted based on the timing of said shifted reference mask signal.

4. The memory interface circuit according to claim 1, wherein said system clock synchronizing circuit specifies a phase shift amount when said system clock signal is shifted based on said phase difference data, and generates said read clock signal based on said phase shift amount.

5. The memory interface circuit according to claim 4, wherein said system clock synchronizing circuit comprises:
    a phase shift circuit configured to generate said read clock signal; and
    a reading circuit configured to read parallel data supplied from a serial/parallel converting circuit in response to said read clock signal, wherein said phase shift circuit comprises: a flip-flop group configured to generate a plurality of clock signals whose phases are different from each other, by shifting the phase of said system clock signal gradually; and a selector circuit configured to select one of said plurality of clock signals in response to said phase difference data, wherein said phase shift circuit supplies the selected clock signal to said reading circuit as said read clock signal.

6. An operation method of a memory interface circuit, the operation method comprising:

transmitting a system clock signal which is supplied through a reference node, to a memory via a clock signal supply buffer;

receiving a data strobe signal which is supplied from said memory by a data strobe buffer;

detecting a transmission delay from said clock signal supply buffer to said data strobe buffer by a delay detecting circuit provided at a front-stage of said system clock synchronizing circuit;

synchronizing data read from said memory with said system clock signal by said system clock synchronizing circuit to supply to logic circuit, wherein said detecting comprises:

generating a phase difference data indicating said transmission delay based on a difference between a phase of said system clock signal and a phase of said data strobe signal outputted from said data strobe buffer; and supplying said phase difference data to said system clock synchronizing circuit, wherein said synchronizing comprises:

generating a read clock signal by shifting said system clock signal based on said phase difference data; and controlling a supply timing at which said data is supplied to said logic circuit based on said read clock signal, and wherein said detecting further comprises:

specifying a rising timing and a falling timing of said data strobe signal based on a mask signal to deactivate said data strobe signal; and generating said phase difference data based on an effective period of said data strobe signal which is determined based on the specified rising timing and the specified falling timing.

7. The operation method of the memory interface circuit according to claim 6, wherein said detecting comprises:

generating said mask signal and a reference mask signal as a reference of said mask signal in response to a mask signal generation instruction;

shifting said mask signal gradually to generate a shifted mask signal; and specifying the falling timing of said data strobe signal based on the shift of said data strobe signal based on a timing of said shifted mask signal.

8. The operation method of the memory interface circuit according to claim 7, wherein said detecting further comprises:

shifting said reference mask signal gradually to generate a shifted reference mask signal; and specifying the rising timing of said data strobe signal based on a shift result based on the shift of said data strobe signal based on a timing of said shifted reference mask signal.

9. The operation method of the memory interface circuit according to claim 6, wherein said synchronizing comprises:

specifying a phase shift amount indicating a shift amount of said system clock signal based on said phase difference data; and generating said read clock signal based on said phase shift amount.

10. The operation method of the memory interface circuit according to claim 9, wherein said synchronizing comprises:

generating a plurality of clock signals which are different in phase by gradually shifting a phase of said system clock signal;

selecting one of said plurality of clock signals in response to said phase difference data;

supplying the selected clock signal to a reading circuit as the read clock signal; and reading parallel data supplied from a serial/parallel conversion circuit in response to said read clock signal.

11. An information processing apparatus comprising:

a memory module configured to operate in synchronization with a memory clock signal;

a logic circuit configured to operate in synchronization with a system clock signal; and a memory interface circuit provided between said memory module and said logic circuit, wherein said memory interface circuit comprises:

a clock signal supply buffer configured to send said system clock signal which is supplied through a reference node, to said memory module through a transmission line;

a data strobe buffer configured to receive a data strobe signal supplied from said memory module;

a system clock synchronizing circuit configured to supply data read from said memory module to said logic circuit in synchronization with said system clock signal; and a delay detecting circuit provided at a front stage to said system clock synchronizing circuit and configured to detect a transmission delay from said clock signal supply buffer to said data strobe buffer, wherein said delay detecting circuit generates a phase difference data indicating said transmission delay based on a difference between a phase of said system clock signal and a phase of said data strobe signal outputted from said data strobe buffer, and supplies said phase difference data to said system clock synchronizing circuit, wherein said system clock synchronizing circuit generates a read clock signal by shifting said system clock signal based on said phase difference data, and controls a supply timing at which said data is supplied to said logic circuit, based on said read clock signal, and wherein said delay detecting circuit specifies a rising timing and a falling timing of said data strobe signal based on a mask signal which deactivates said data strobe signal, and generates said phase difference data based on an effective period of said data strobe signal which is determined based on the specified rising timing and the specified falling timing.

12. The information processing apparatus according to claim 11, wherein said delay detecting circuit comprises an operation circuit, a signal generating circuit, and an expectation matching circuit, wherein said signal generating circuit generates said mask signal and a reference mask signal as a reference of said mask signal in response to a mask signal generation instruction, and shifts said mask signal gradually to generate a shifted mask signal, and said expectation matching circuit specifies the falling timing of said data strobe signal based on the shift of said data strobe signal which is based on a timing of said shifted mask signal.

13. The information processing apparatus according to claim 11, wherein said signal generating circuit shifts said reference mask signal gradually to generate a shifted reference mask signal, and said expectation matching circuit specifies the rising timing of said data strobe signal based on a shift result of said data strobe signal which is based on the timing of said shifted reference mask signal.

14. The information processing apparatus according to claim 11, wherein said system clock synchronizing circuit specifies a phase shift amount when said system clock signal is shifted based on said phase difference data, and generates said read clock signal based on said phase shift amount.

15. The information processing apparatus according to claim 14, wherein said system clock synchronizing circuit comprises:

a phase shift circuit configured to generate said read clock signal; and a reading circuit configured to read parallel data supplied from a serial/parallel converting circuit in response to said read clock signal, wherein said phase shift circuit comprises:

a flip-flop group configured to generate a plurality of clock signals whose phases are different from each other, by shifting the phase of said system clock signal gradually; and a selector circuit configured to select one of said plurality of clock signals in response to said phase difference data, wherein said phase shift circuit supplies the selected clock signal to said reading circuit as said read clock signal.

* * * * *